United States Patent
Wang et al.

(10) Patent No.: US 9,006,107 B2
(45) Date of Patent: Apr. 14, 2015

(54) PATTERNED STRUCTURE OF SEMICONDUCTOR DEVICE AND FABRICATING METHOD THEREOF

(75) Inventors: Chih-Jung Wang, Hsinchu (TW); Tong-Yu Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 111 days.

(21) Appl. No.: 13/417,299

(22) Filed: Mar. 11, 2012

(65) Prior Publication Data
US 2013/0234301 A1 Sep. 12, 2013

(51) Int. Cl.
*H01L 21/311* (2006.01)
*H01L 21/033* (2006.01)

(52) U.S. Cl.
CPC ........ *H01L 21/0337* (2013.01); *H01L 21/0338* (2013.01)

(58) Field of Classification Search
CPC .................. H01L 21/0338; H01L 21/0337
USPC ............... 438/694; 257/E21.258, E29.13
See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,087,477 B2 | 8/2006 | Fried | |
| 7,091,551 B1 | 8/2006 | Anderson | |
| 7,112,495 B2 | 9/2006 | Ko | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,521,324 B2 | 4/2009 | Ohmi | |
| 7,531,437 B2 | 5/2009 | Brask | |
| 7,569,857 B2 | 8/2009 | Simon et al. | |
| 7,592,270 B2 | 9/2009 | Teo | |
| 7,629,643 B2 | 12/2009 | Pillarisetty | |
| 7,781,847 B2 | 8/2010 | Yang | |
| 7,825,437 B2 | 11/2010 | Pillarisetty | |
| 7,915,691 B2 | 3/2011 | Wong | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0015365 A1 | 1/2007 | Chen | |
| 2007/0072376 A1 | 3/2007 | Chen | |
| 2007/0108528 A1 | 5/2007 | Anderson | |
| 2007/0158756 A1 | 7/2007 | Dreeskornfeld | |
| 2007/0218661 A1 | 9/2007 | Shroff | |
| 2008/0061366 A1 | 3/2008 | Liu | |
| 2008/0135948 A1* | 6/2008 | Wang ........................ 257/392 |

(Continued)

*Primary Examiner* — Amar Movva
(74) *Attorney, Agent, or Firm* — Winston Hsu; Scott Margo (57) ABSTRACT

A method for fabricating a patterned structure in a semiconductor device is provided. First, a substrate with a first region and a second region is provided. Then, a plurality of sacrificial patterns is respectively formed within the first region and the second region. A first spacer is then formed on the sidewalls of each of the sacrificial patterns followed by forming a mask layer to cover the sacrificial patterns located within the first region. Finally, the first spacer exposed from the mask layer is trimmed to be a second spacer and the mask layer is then removed.

11 Claims, 11 Drawing Sheets

(56) References Cited

U.S. PATENT DOCUMENTS

| | | |
|---|---|---|
| 2008/0157208 A1 | 7/2008 | Fischer |
| 2009/0057759 A1 | 3/2009 | Obradovic |
| 2009/0124097 A1 | 5/2009 | Cheng |
| 2009/0200494 A1 | 8/2009 | Hatem |
| 2009/0242964 A1 | 10/2009 | Akil |
| 2009/0269916 A1 | 10/2009 | Kang |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |

* cited by examiner (A)

PATTERNED STRUCTURE OF SEMICONDUCTOR DEVICE AND FABRICATING METHOD THEREOF

BACKGROUND OF THE INVENTION

1. Field of the Invention

The present invention generally relates to the field of patterned structures of semiconductor devices, and more particularly, to a patterned structure with sub-lithographic features and a fabrication method thereof.

2. Description of the Prior Art

With the trend in the industry being towards scaling down the size of metal oxide semiconductor transistors (MOS), three-dimensional or non-planar transistor technology, such as fin field effect transistor technology (Fin FET) has been developed to replace planar MOS transistors. In current techniques, in order to meet the sub-lithographic features, a regular photolithography and an etching process accompanied with a pull back process are provided to form fin structures in the Fin FET. Additionally, semiconductor device manufacturers also utilize a pattern transfer technique, such as sidewall image transfer (SIT) to form required fin structures.

In general, SIT may include the following steps. First, a plurality of dummy patterns is formed on a substrate, wherein the dimension of the dummy patterns is larger than the sub-lithographic features. Next, spacers are formed on the sidewalls of the dummy patterns through a deposition and an etching process. Since the dimension of the spacers may have the sub-lithographic features, patterns of the spacers may be transfer into the substrate by using the spacers as mask. However, this method has it limits and drawbacks, such as all of the spacers can only have the same width. This phenomenon will restrict the applicability of the SIT technique. For example, in static random access memory (SRAM), the layout of spacers is used to define the shape and width of carrier channels. Since the ratio between certain channels will influence the value of static noise margin (SNM) of the SRAM, the value of SNM can not be increased successively in the conventional SIT technique with all of the spacers have the same widths.

In order to overcome the above-mentioned drawbacks, there is a need to provide patterned structures and a novel fabrication method thereof so that the patterned structures with sub-lithographic features can have variable width through a simple and convenient way.

SUMMARY OF THE INVENTION

The main objective of the invention is to provide a patterned structure of a semiconductor device and a fabrication method thereof that can solve the problems of the conventional techniques.

According to one embodiment, the present invention provides a method for fabricating a patterned structure of a semiconductor device, which includes the following steps. A substrate comprising a first region and a second region is provided; a plurality of a sacrificial patterns are formed in the first region and the second region respectively; a first spacer is formed on the sidewalls of each sacrificial pattern; a mask layer is formed on the substrate, wherein the mask layer covers the sacrificial patterns within the first region; the first spacer within the second region is trimmed to be a second spacer; and the mask is removed.

According to another embodiment of the present invention, the present invention provides a method for fabricating a patterned structure of a semiconductor device, which includes the following steps. First, a substrate comprising a first region and a second region is provided; a plurality of a sacrificial patterns is formed in the first region and the second region respectively; a first spacer is formed on the sidewalls of each sacrificial pattern; a first etching process is performed to remove the first spacer within the second region; a second spacer is formed around the sidewalls of each sacrificial pattern; and the sacrificial patterns are finally removed.

In another embodiment of the present invention, the invention provides a patterned structure of a semiconductor device, which comprises the following components. A substrate; and at least a first patterned structure and a second patterned structure are provided, wherein the first patterned structure is parallel to the second patterned structure, the first patterned structure and the second patterned structure have a first line width and a second line width respectively, and the first line width is twice as wide as the second line width, and the second line width has a sub-lithographic feature.

In summary, the present invention provides a patterned structure and a fabrication method thereof. The applicability of the pattern transfer technique can be further improved due to the width of each of the patterned structures being not only under the sub-lithographic feature but also different from one another.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings:

FIGS. 1-10 are schematic diagrams showing a method for fabricating a patterned structure of a semiconductor device according to several embodiments of the invention, wherein

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following description, numerous specific details are given to provide a thorough understanding of the invention. It will, however, be apparent to one skilled in the art that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

Figure 11A:
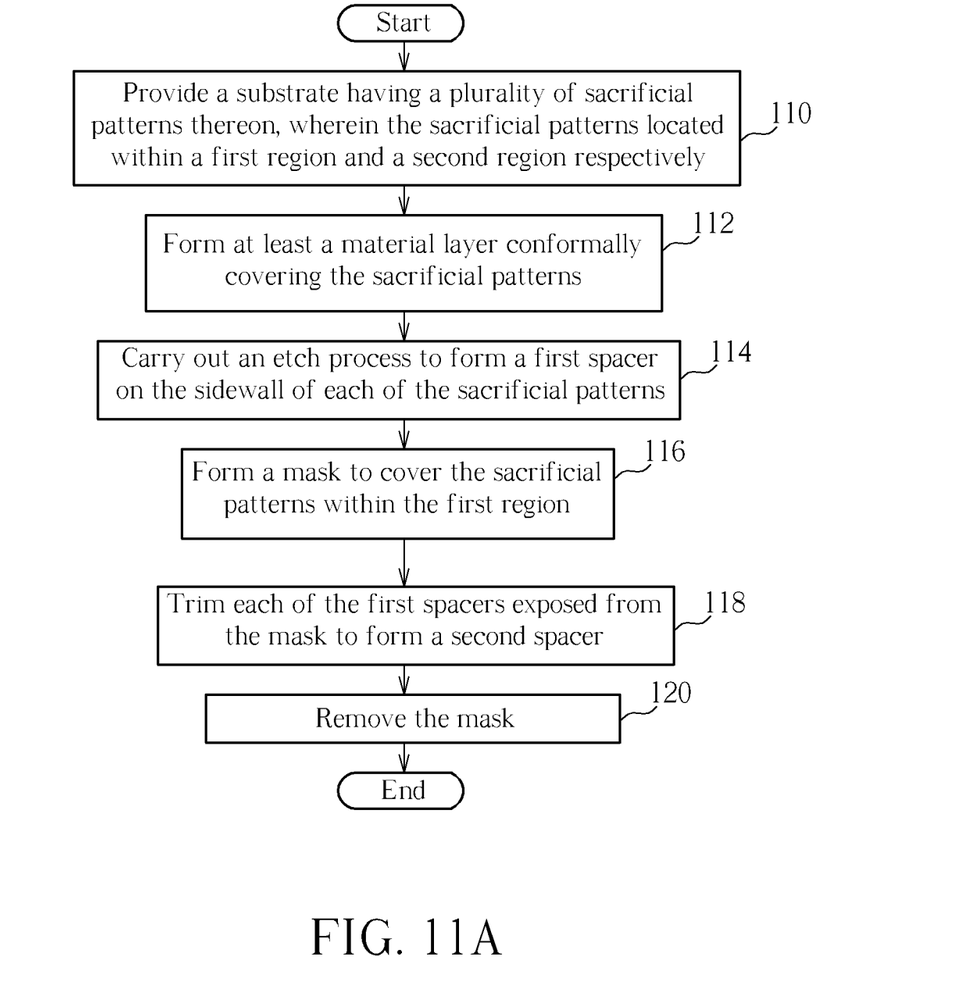
FIG. 11(A) is a flow chart illustrating a method for fabricating a patterned structure of a semiconductor device according to one embodiment of the present invention.

Please refer to FIGS. 1-6 accompanied with FIG. 11(A). FIGS. 1-6 are schematic, top view and cross-sectional diagrams showing a method for fabricating a patterned structure of a semiconductor device according to one embodiment of the invention; and FIG. 11(A) is a corresponding flow chart. As shown in FIGS. 1(A) and (B), wherein FIG. 1(B) is a cross-sectional diagram taken along a line AA' in FIG. 1(A), a step 110 is carried out. First, a substrate 12, such as a bulk silicon substrate or a silicon-on-insulator substrate, is provided, which can be divided into two regions, i.e. the first region 1 and the second region 2. A plurality of sacrificial patterns 18, such as doped or undoped polysilicon, is then formed within the first region 1 and the second region 2 through a regular deposition, photolithography and etching process. Because of the limited capability of the processing machine, a first width W1 of each of the sacrificial patterns 18 is substantially larger than the minimum exposure limit of the corresponding photolithography process. In addition, a cap layer 14 may be optionally formed between the substrate 12 and the sacrificial patterns 18 before the formation of the sacrificial patterns 18. The cap layer 14 can serve not only as a mask in the following pattern transfer process but also be used as a protective layer to protect the substrate 12 from unwanted damages. It is worth noting that, the phrase like "minimum exposure limit of the corresponding photolithographic process" throughout the specification should be regarded as a dimension under which it is impossible to obtain a "sub-lithographic feature" by regular lithographic and etching processes, that is to say, the size of the minimum exposure limit of the corresponding photolithography process is larger than the sub-lithographic feature.

Figure 1:
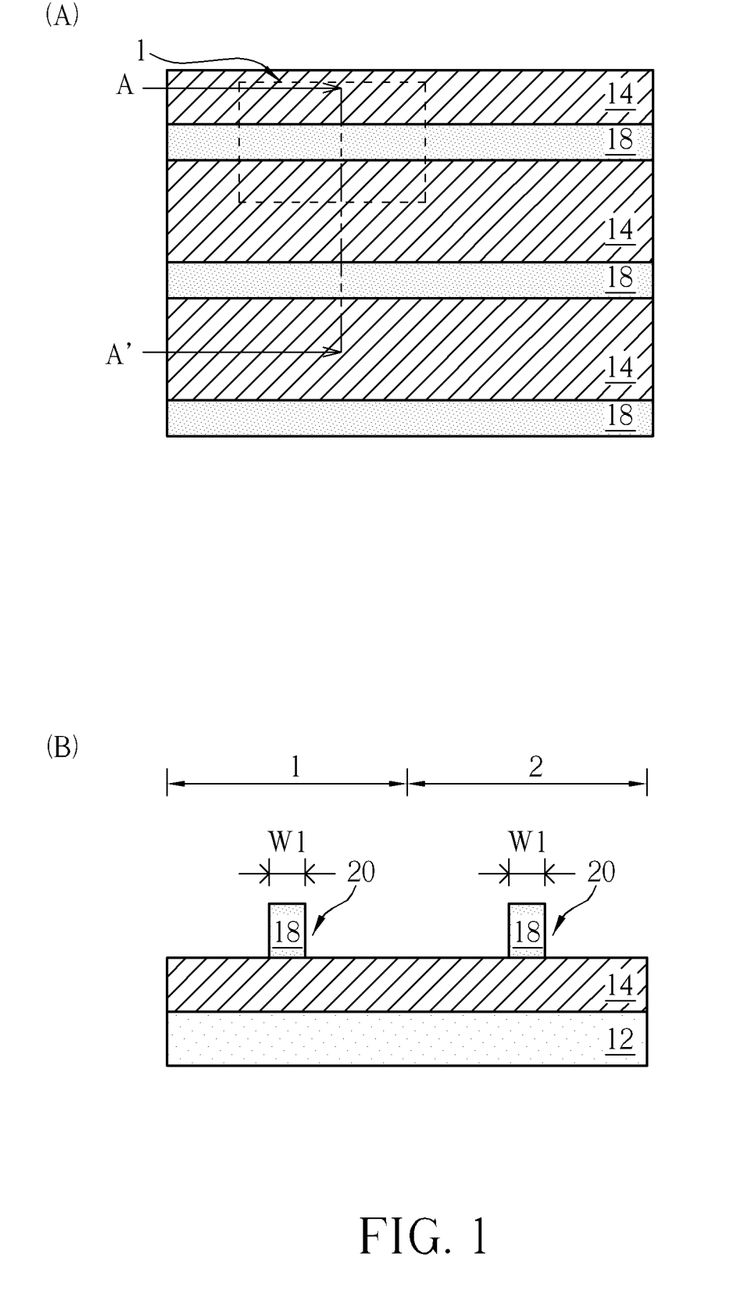
FIGS. 1-6 are schematic, top view and cross-sectional diagrams showing a method for fabricating a patterned structure of a semiconductor device according to one embodiment of the invention.
Figure 2:
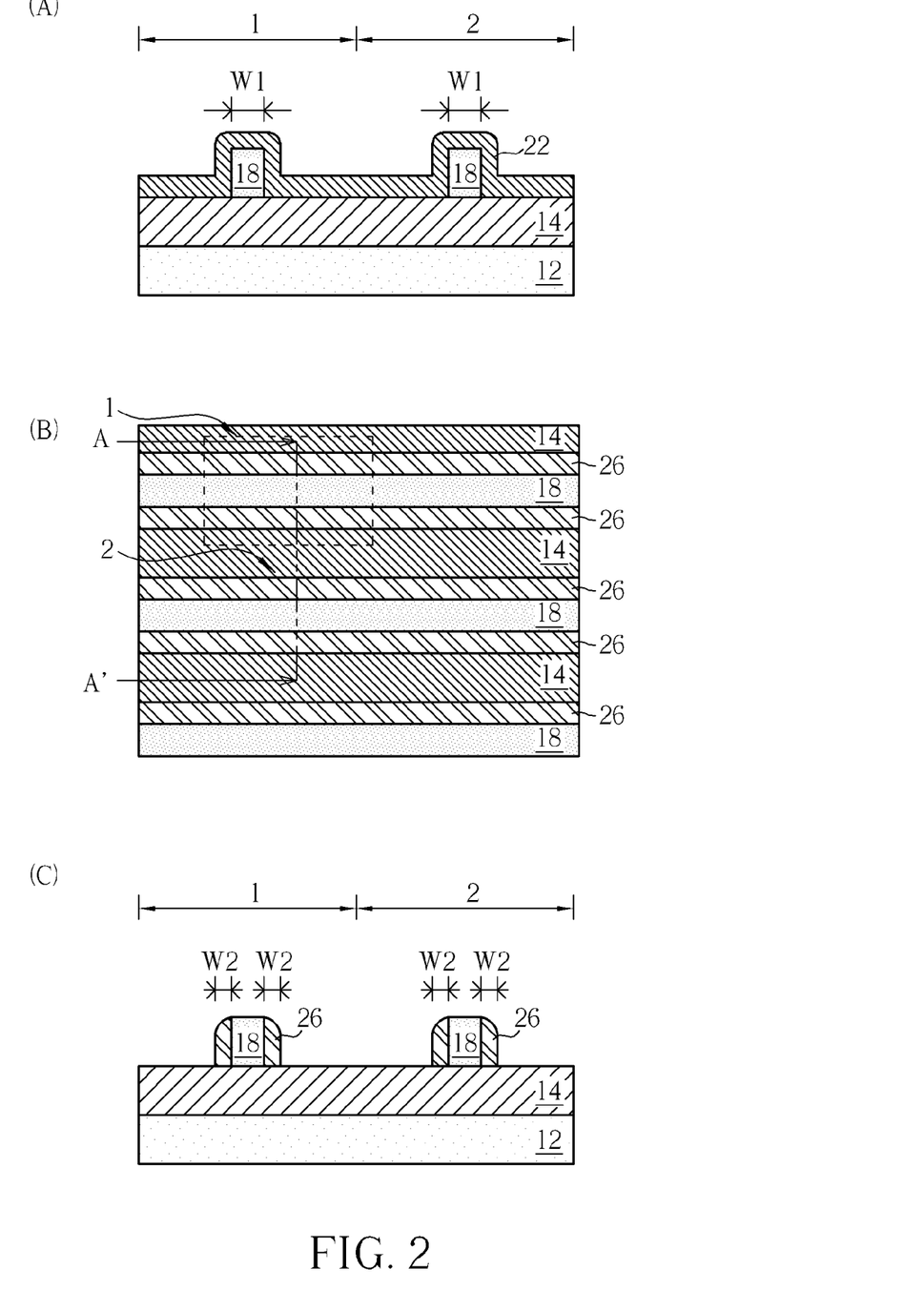

Then, a step 112 is carried out. As shown in FIG. 2, at least a material layer 22 is formed to cover each of the sacrificial patterns 18 conformally. The material layer 22 may be selected from a material having an etching rate different from that of the sacrificial patterns 18 and cap layer 14 under a same etching recipe, such as silicon nitride, silicon oxide, silicon oxynitride, silicon carbide or the like. Please refer to FIGS. 2(B) and (C), wherein the FIG. 2(B) is a top view of FIG. 2(C). The material layer 22 can be blanketly etched (etched without mask) into a first spacer 26 on the sidewalls 20 of each of the sacrificial patterns 18 by performing a step 114. At this time, each first spacer 26 has a second width W2, wherein the second width W2 is preferably smaller than the first width W1 and is preferably under the sub-lithographic feature size. It should be noted that, according to this embodiment, under a same etching recipe, specific etching rate among the sacrificial patterns 18, the cap layer 14, the substrate 12, the material layer 22 and the first spacer are required. For example, the etching rate of the material layer 22 is higher than that of the sacrificial layer 18 and the cap layer 14 under a same etching recipe; the etching rate of the sacrificial layer 18 is higher than that of the first spacer 26 under another same etching recipe; under still another same etching recipe, the etching rate of the cap layer 14 is higher than that of the first spacer 26. Additionally, other choices of the etching rates among these materials may still be possible. For example, under a same etching recipe, the etching rate of the cap layer is higher than that of the first spacer 26 and the sacrificial layer 18.

Figure 3:
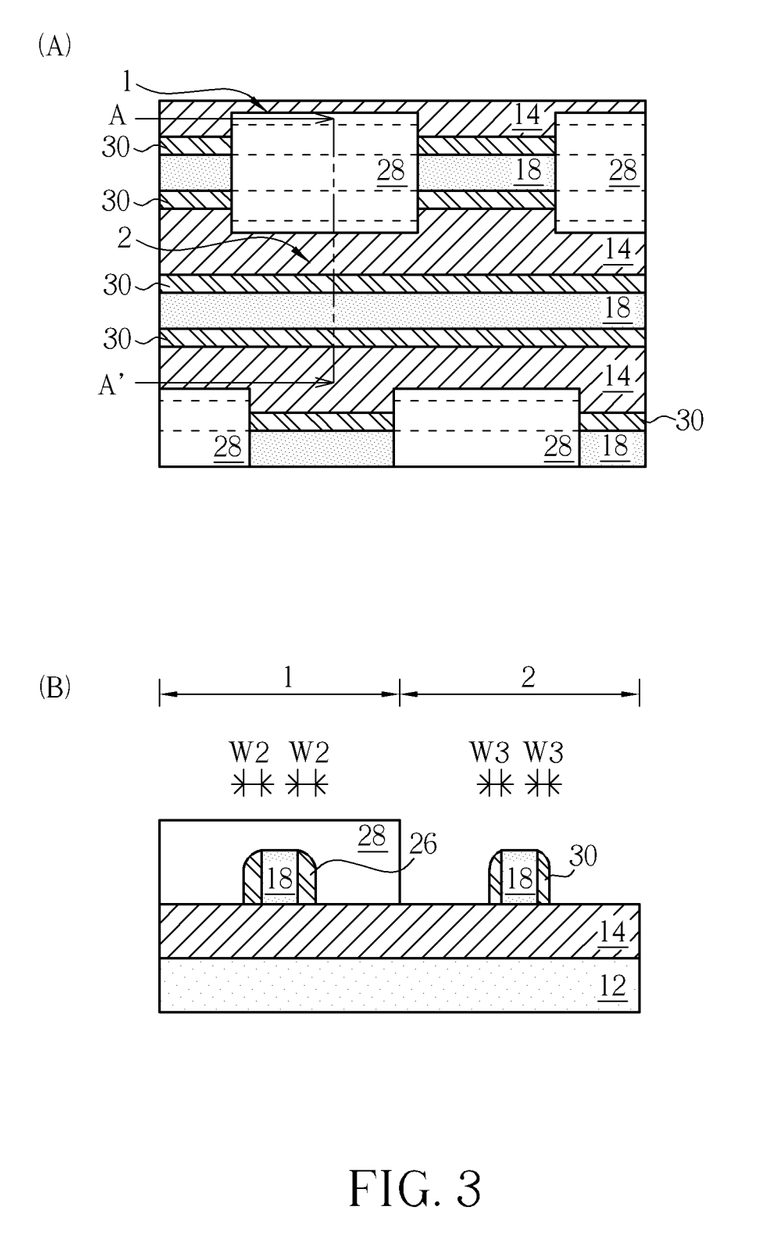
Figure 4:
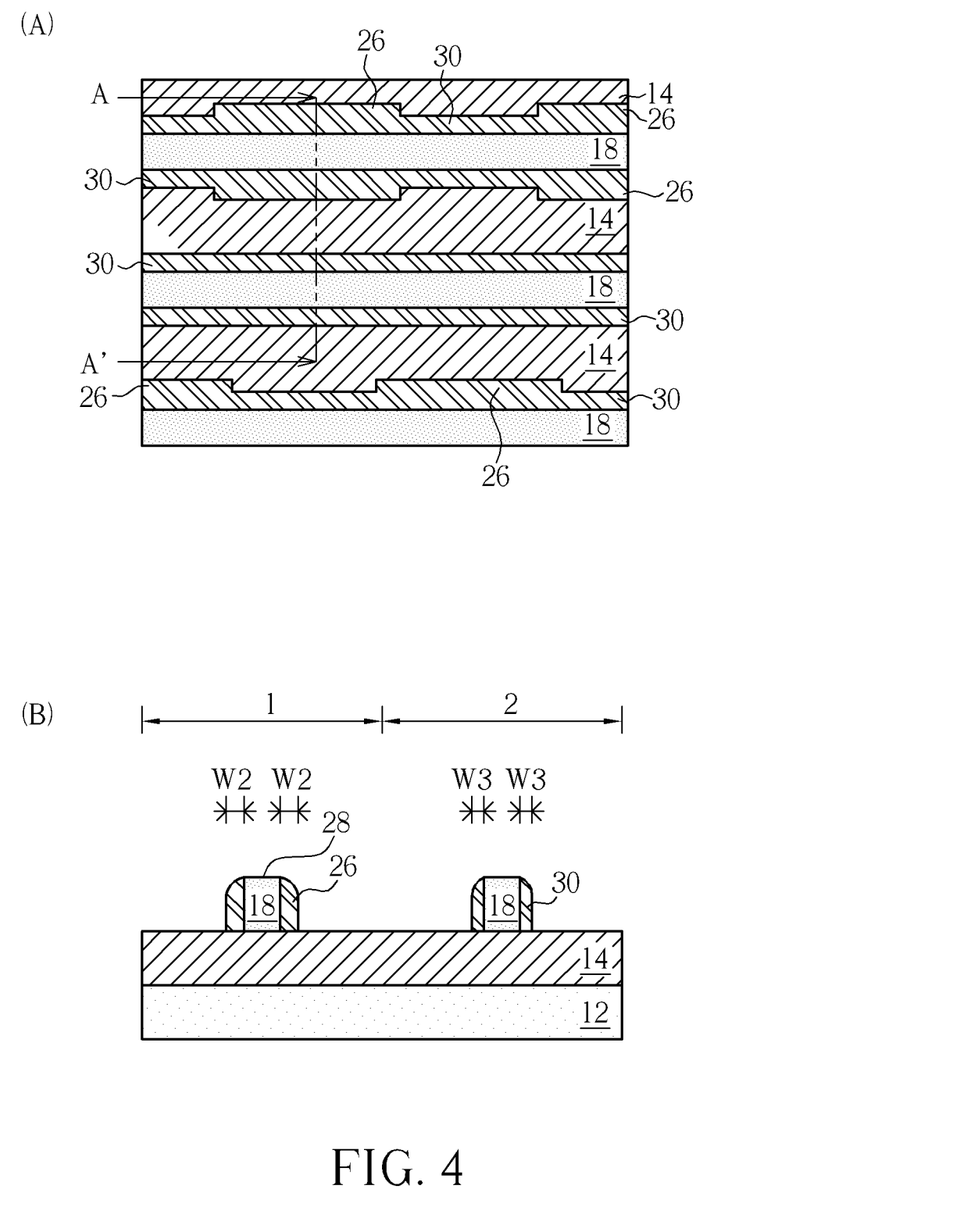

Please refer to FIGS. 3(A) and (B). A mask 28 within the first region 1 is formed by carrying out a step 116, wherein the mask 28 covers each of the sacrificial patterns 18 and each first spacer 26. The mask 28 may be selected from photoresist or other polymer with similar properties, or it may be an etching stop layer composed of silicon compounds, but is not limited thereto. A step 118 is then carried out, which includes a regular etching process, such as a plasma etching process, to trim each of the first spacer 26 exposed from the mask 28 into a second spacer 30. At this time, each of the second spacers 30 has a third width W3 which is thinner than the second width W2. As shown in FIGS. 4(A) and (B), a step 120 is finally carried out to remove the mask 28 completely so that each of the sacrificial patterns 18 and the first spacers 26 can be exposed. Through the above-described trimming process, the width of the second spacers 30 is thinner than the width of the first spacers 26. Additionally, both of the second width W2 and the third width W3 are substantially smaller than the sub-lithographic feature size.

Figure 5:
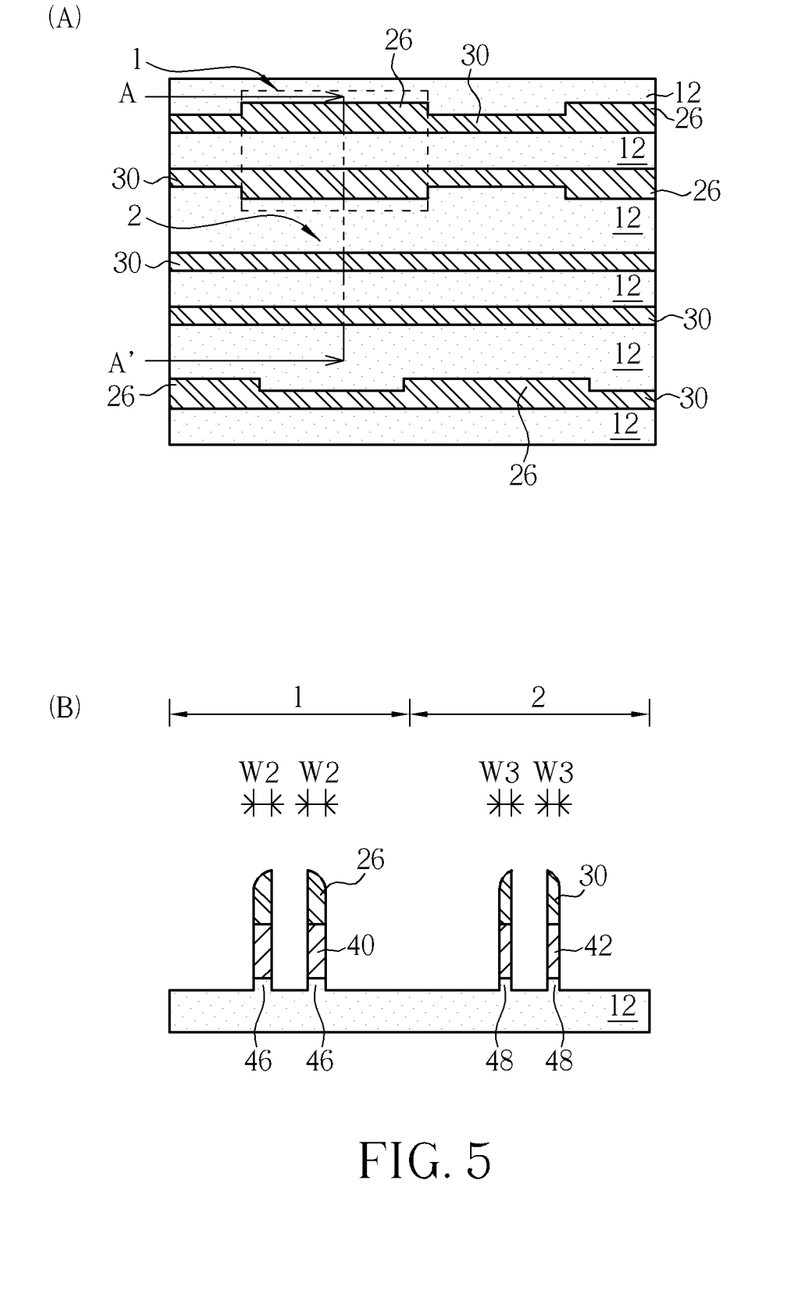

As shown in FIGS. 5(A) and (B), the sacrificial patterns 18 within the first region 1 and the second region 2 are removed completely while patterns of the first spacers 26 and the second spacers 30 are transferred to the substrate 12 through a pattern transfer process, like a sidewall image transfer (SIT). It should be noted that the pattern transfer process may include a plurality of etching processes and a corresponding preferred embodiment is described as follows. First, the sacrificial patterns 18 are removed completely by using a regular etching process, such as dry etching or wet etching, so that only the first spacers 26 and the second spacers 30 are on the cap layer 14. In this etching process, since the etching rate of the sacrificial layer 18 is higher than that of the first spacer 26 and the second spacer 30, only slight or even no first spacers 26 and second spacers 30 are etched away. Then, by using the first spacers 26 and the second spacers 30 as masks, one or more than one anisotropic etching processes are carried out to sequentially etch down to the cap layer 14 and/or to the substrate 12. At this time, the patterns defined by the first spacers 26 and the second spacers 30 can be transferred to the cap layer 14 and/or the substrate 12.

It is worth noting that, in the above pattern transfer process, the width of each of the first spacers 26 and the second spacers 30 may be trimmed away slightly, therefore, the first patterned structure 46 and the second patterned structure 48 are thinner than the corresponding second width W2 and the corresponding third width W3. However, the width of the first patterned structure 46 and the second patterned structure 48 is preferably identical to the corresponding second width W2 and the corresponding third width W3

Figure 6:
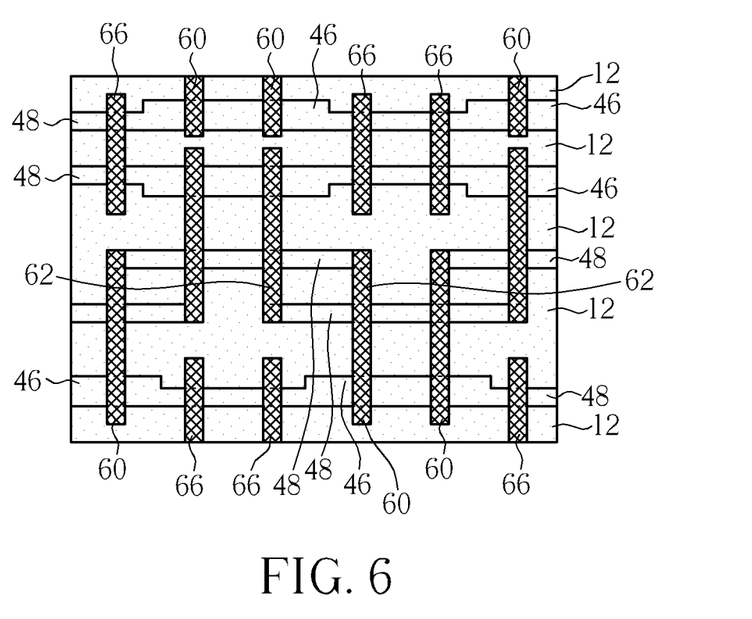

Finally, other related semiconductor fabricating processes can be further carried out. As shown in FIG. 6, the first spacers 26, the second spacers 30, a first mask pattern 40 and a second mask pattern 42 are removed completely to expose the first patterned structures 46 and the second patterned structures 48. Then, portions of the first patterned structures 46 and the second patterned structures 48 are cut off. A gate formation process is then carried to fabricate several gate structures 60, 62 and 66 overlaying the respective patterned structures 46 and 48 so that a SRAM structure with six FET is obtained (6T-SRAM). Since the gate formation process is not a new feature in the present invention, its description is therefore omitted for the sake of clarity.

In the preceding paragraph, patterns of the first spacer 26 and the second spacer 30 are directly transferred into the substrate 12, that is to say, it can be seen as a positive image transfer. The patterned structures in the substrate 12, however, may be a negative image of the patterns of the spacers. In the following paragraph, the method for fabricating the patterned structures with the negative image will be described in detail. First, after the step 120 illustrated in the FIG. 4 is completed, the sacrificial patterns 18 are removed by applying a suitable etching process. Then, at least a deposition and a planarization process are carried out to form a layer of filler; in this case, the filler (not shown) can replace the sacrificial patterns 18 and cover the space exposed from the first spacers 26 and the second spacers 30. In addition, a portion of the first spacers 26 and the second spacers 30 may be exposed from the filler during the planarization process. Then, the first spacers 26 and the second spacers 30 are removed concurrently or separately so that a plurality of trench patterns (not shown) with different widths is formed in the filler layer. A pattern transfer process is further carried out to transfer the trench patterns into the cap layer 14 and/or the substrate 12 by using the trench patterns as masks. Similarly, the pattern transfer process may include one or more than one anisotropic etching processes. At this time, the negative image defined by the trench patterns is obtained.

Figure 7:
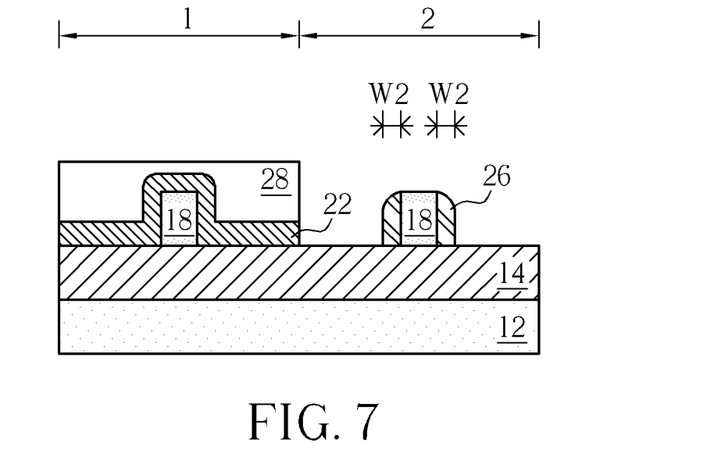
FIG. 7 is schematic top view and cross-sectional diagram showing a method for fabricating a patterned structure of a semiconductor device according to another embodiment of the invention.
Figure 11B:
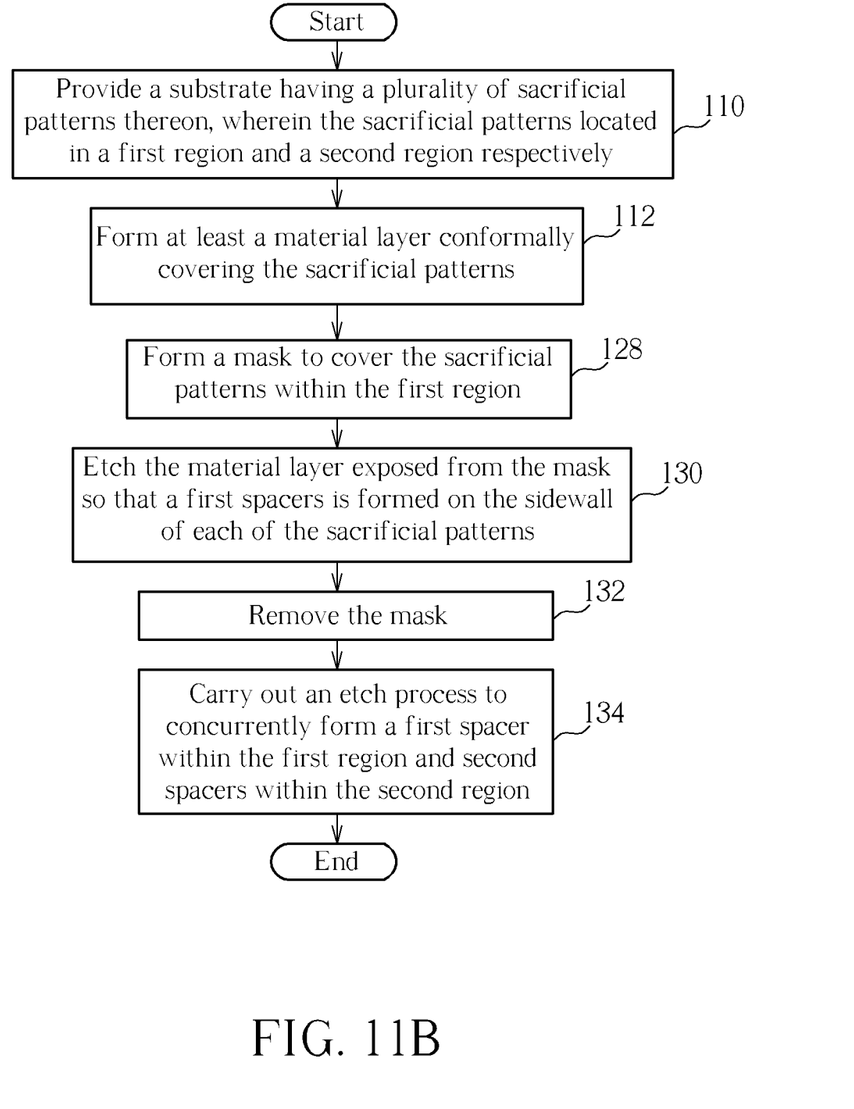
FIG. 11(B) is a flow chart illustrating a method for fabricating a patterned structure of a semiconductor device according to another one embodiment of the present invention.

In addition, the present invention further includes a second embodiment. A fabrication method according to this embodiment is almost similar and complementary to the first embodiment shown in the FIGS. 1-6. However, in this embodiment, the first spacers 26 within the first region 1 and the second region 2 are not formed simultaneously. In the following paragraph, only difference parts between these two embodiments are described for the sake of brevity and the similar parts can be understood by reference to corresponding FIGS. 1-6. Please refer to FIG. 7 accompanied with FIG. 11(B). The step shown in FIG. 7 is subsequent to the step shown in FIG. 2(B). First, a mask 28 is formed by carrying out the step 128, wherein the mask 28 can cover the sacrificial patterns 18 and the material layer 22 within the first region 1. Similarly, the mask 28 may be selected from photoresist or another polymer with similar properties, or it may be an etching stop layer composed of silicon compounds. Then, a step 130 is carried out. The material layer 22 exposed from the mask 28 can be etched into a first spacer 26 on the sidewalls 20 of each sacrificial pattern 18 within the second region 2. At this time, each of the sacrificial patterns 18 within the first region 1 is still covered by the material layer 22 so that there is no first spacer 26 within the first region 1. The mask layer 28 is removed by performing a step 132. Finally, a step 134 is carried out, which includes a regular etching process, such as a plasma etching process, to simultaneously trim each of the first spacers 26 into the second spacer 30 and etch the material layer 22 overlaying the sacrificial patterns 18 into a first spacer 26. In this case, the first spacer 26 is on the sidewall 20 of each of the sacrificial patterns 18 within the first region 1, as shown in FIG. 4. Similarly, each of the second spacers 30 has a third width W3 which is thinner than the second width W2. Additionally, both of the second width W2 and third width W3 have sub-lithographic features. Unlike in the first embodiment, the main feature of the embodiment is that the mask 28 is removed first before forming the first spacers 26 and the second spacer 30 within the first region 1 and the second region 2 respectively. Similarly, the second embodiment can also be integrated into another semiconductor fabricating processes. The following pattern transfer process is like the process described in the first embodiment and patterned structures may also be positive images or negative images corresponding to the spacer patterns, and the detailed description will therefore be omitted for the sake of clarity.

Figure 8:
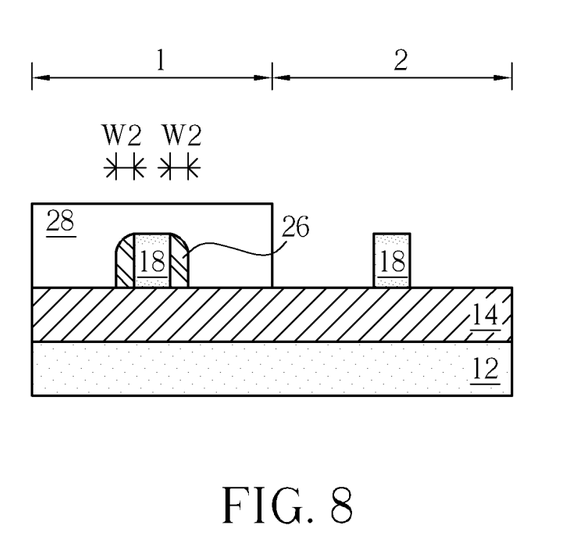
FIGS. 8-10 are schematic top view and cross-sectional diagrams showing a method for fabricating a patterned structure of a semiconductor device according to still another embodiment of the invention.
Figure 9:
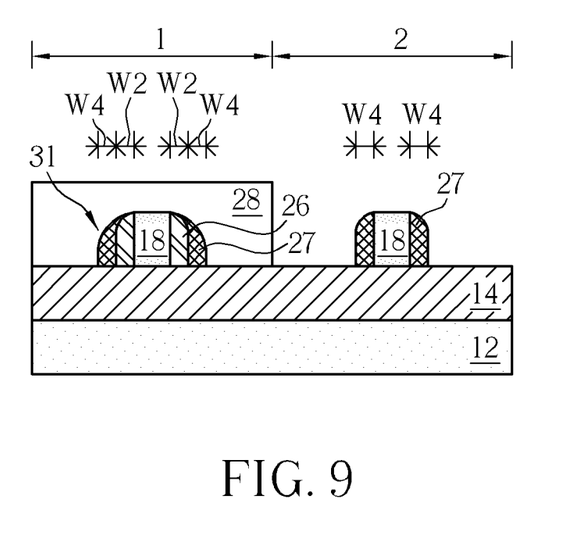
Figure 11C:
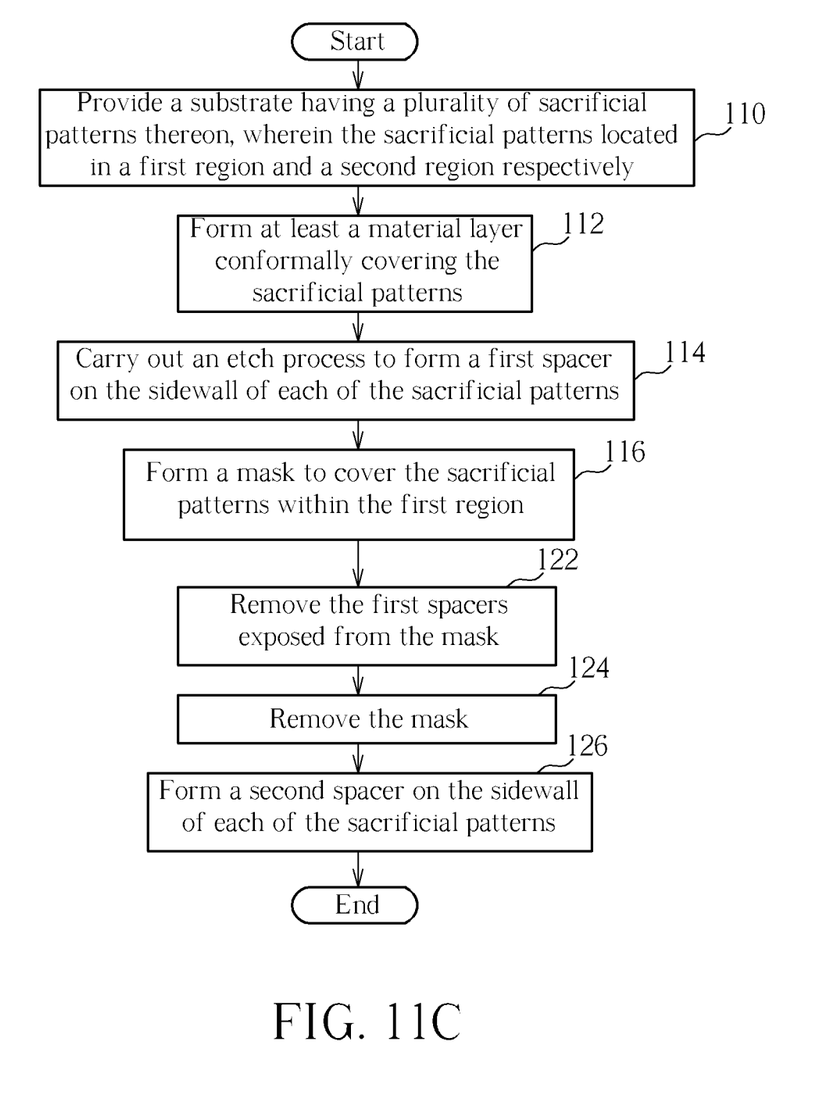
FIG. 11(C) is a flow chart illustrating a method for fabricating a patterned structure of a semiconductor device according to still another one embodiment of the present invention.

The present invention further includes a third embodiment. Please refer to FIGS. 8-9 accompanied with the flow chart shown in FIG. 11. A fabrication method shown in the FIGS. 8-9 is almost similar and complementary to the first embodiment shown in the FIGS. 1-6. In this embodiment, however, the first spacer 26 within the second region 2 is removed before forming a second spacer 27 within the first region 1 and the second region 2 respectively. In the following paragraph, only different parts between these two embodiments are described for the sake of brevity, since the similar parts can be understood by reference to corresponding FIGS. 1-6. Please refer to FIG. 8. A step shown in FIG. 8 is subsequent to the step shown in FIG. 2. First, the mask 28 is formed by carrying out the step 116, wherein the mask 28 can cover the sacrificial patterns 18 within the first region. As said before, the mask 28 may be selected from photoresist or other polymer with similar property, or it may be an etching stop layer composed of silicon compounds. A step 122 is then carried out. All the first spacers 26 within the second region 2 are removed completely through a regular etching process, such as a wet etching or a dry etching, so that the sidewalls of each of the sacrificial patterns 18 is not covered by any layer. As shown in FIG. 9, a step 124 is performed to remove the mask 28. Then, through performing a step 126, a second spacer 27 is formed separately around the sidewalls of each of the sacrificial patterns 18 through a deposition and an etching process. At this time, only the second spacer 27 exist on the sidewalls 20 of each of the sacrificial patterns 18 within the second region 2, while a first stacked-spacer 31, which comprises the first spacer 26 and the second spacer 27, is on the sidewalls 20 of each of the sacrificial patterns 18 within the first region 1. In addition, a fourth width W4 of the second spacer 27 and/or the width of the first stacked-spacer 31 have the sub-lithographic features, and the fourth width W4 is thinner than the width of the first stacked-spacer 31. Similarly, the embodiment can also be integrated into other related semiconductor fabricating processes. The following pattern transfer process is like the process described in the first embodiment and patterned structures may also be positive images or negative images corresponding to the spacer patterns, and the detailed description will therefore be omitted for the sake of clarity.

Figure 10:
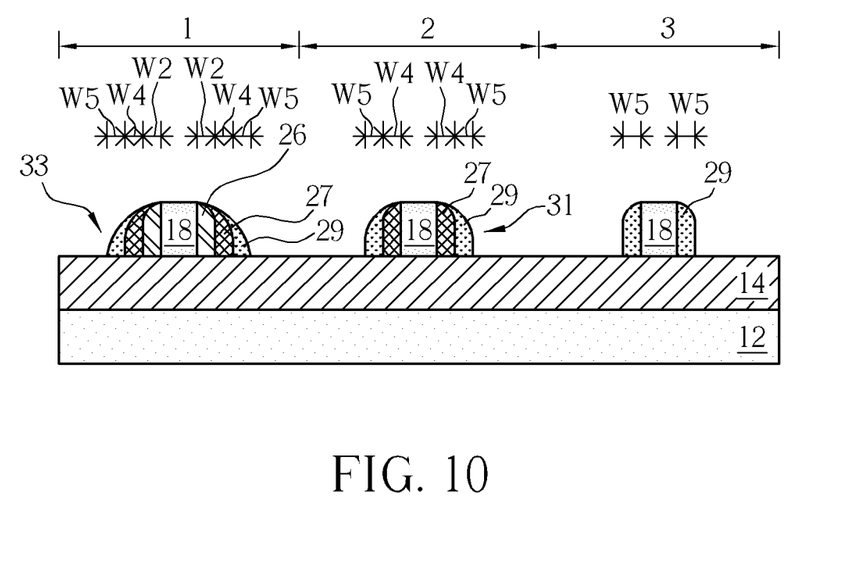

In the previous embodiments, the substrate 12 is only defined with two regions, i.e. the first region 1 and the second region 2, and there are only the first spacers 26 and the second spacers 27 and 30 formed on the substrate 12. According to different requirements, the substrate 12 may however be defined with more than two regions and formed with more than two spacers. This concept will be detailed in the following paragraph, but the concept may be equally applied to the corresponding first embodiment and the corresponding second embodiment without departing from the scope and the spirit of the invention. Please refer to FIG. 10 accompanied with the corresponding FIGS. 1-2, 8-9. A step shown in FIG. 10 is subsequent to the step shown in FIG. 9, as similar to the step in FIG. 1, when the sacrificial patterns 18 are formed within the first region 1 and the second region 2, at least one sacrificial pattern 18 is formed within the third region 3. Then, as shown in FIG. 10 and similarly to the step in FIG. 2, when the first spacers 26 are formed within the first region 1 and the second region 2, at least one first spacer 26 is formed on the sidewalls 20 of each of the sacrificial patterns 18 within the third region 3. As shown in FIG. 10 and similarly to the step in FIG. 8, when the first etching process is performed, the first spacers 26 within the second region 2 and the third region 3 are removed separately. As shown in FIG. 10 and similarly to the step shown in FIG. 2, when the second spacer 27 is formed within the second region 2, at least one second spacer 30 is formed on the sidewall 20 of each of the sacrificial patterns 18 within the third region 3. Then, as shown in FIG. 10, a mask (not shown) is formed to cover the sacrificial patterns 18 within the first region 1 and the second region 2, followed by performing a second etching process to completely remove the second spacer 27 within the third region 3. A deposition and an etching process are further carried out so that a third spacer 29 is formed around the sidewalls 20 of each of the sacrificial patterns 18 within the first region 1, the second region 2 and the third region 3. At this time, each of the third spacers 29 has a fifth width W5. A second stacked-spacer 33, which comprises the first spacer 26, the second spacer 27 and the third spacer 29, is on the sidewalls 20 of each of the sacrificial patterns 18 within the first region 1. Preferably, the third spacers 29, the second stacked-spacer 33 and the first stacked-spacer 31 have the sub-lithographic features. Therefore, by applying the concept to the various embodiments, a stacked-spacer with more than two layers can be formed around the sidewalls 20 of each of the sacrificial patterns 18. This way the applicability of the spacer structures within the sub-lithographic feature size can be further increased.

In order to provide a better understanding, only the SRAM structure is provided in each embodiment. According to different requirements, the SRAM structure may however be equally replaced with another semiconductor device, such as a device in a logic circuitry. Furthermore, the method for fabricating the patterned structures can be applied to the process for fabricating contact plugs or interconnections so that the physical size of the contact plugs or the interconnections may have the sub-lithographic feature.

In summary, the present invention provides a patterned structure of a semiconductor device and a fabricating method thereof, wherein at least a first patterned structure 46 and at least a second patterned structure 48 are disposed on the substrate 12. The first patterned structure 46 extends parallel to the second patterned structure 48. In addition, the first patterned structure 46 and the second patterned structure 48 have a second width W2 (also called first line width) and a third width W3 (also called second line width) respectively, and the second width W2 is twice as wide as the third width W3, and the third width W3 has a sub-lithographic feature. The present invention provides the patterned structure 46 and 48 with different widths and with the sub-lithographic feature by utilizing the SIT technique accompanied with suitable etching processes. Therefore, the SNM of the DRAM can be increased successively.

Although the disclosure has been illustrated by references to specific embodiments, it will be apparent that the disclosure is not limited thereto as various changes and modifications may be made thereto without departing from the scope of the present invention. References to "one embodiment' or "an embodiment' means that a particular feature, structure or characteristic described therein is included in at least one embodiment. Thus, the appearances of the phrase "in one embodiment" or 'in an embodiment" appearing in various places throughout the specification are not necessarily all referring to the same embodiment.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a patterned structure of a semiconductor device, comprising:
   providing a substrate comprising a first region and a second region;
   forming a plurality of sacrificial patterns respectively located in the first region and the second region;
   respectively forming a first spacer on the sidewalls of each of the sacrificial patterns;
   forming a mask layer on the substrate, wherein the mask layer covers the first spacer and the sacrificial patterns within the first region;
   trimming the first spacer within the second region to form a second spacer; and
   removing the mask layer.

2. The method according to claim 1, wherein a step for forming the first spacer comprising:
   forming at least a material layer on the substrate, wherein the material layer conformally covers each of the sacrificial patterns; and
   performing a first etching process to form all of the first spacers.

3. The method according to claim 1, wherein a step for trimming the first spacer within the second region comprising:
   performing a second etching process to etch the mask layer and the first spacer exposed from the mask layer.

4. The method according to claim 1, wherein a step for removing the mask layer is carried out after trimming the first spacer within the second region.

5. The method according to claim 4, wherein the first spacer is directly formed within the first region when a step for trimming the first spacer within the second region is performed.

6. The method according to claim 1, further comprising:
   removing the sacrificial patterns after forming the second spacer; and
   performing an image transfer process to transfer patterns of the first spacer and the second spacer into the substrate.

7. The method according to claim 1, further comprising:
   forming a filler material to replace each of the sacrificial patterns after forming the second spacer; and
   performing an image transfer process to transfer patterns of the filler material into the substrate.

8. The method according to claim 7, further comprising:
   removing the first spacer and the second spacer before performing the image transfer process.

9. The method according to claim 1, further comprising forming a cap layer between the substrate and the sacrificial patterns.

10. The method according to claim 9, wherein an etching selectivity of the sacrificial patterns and the substrate is higher than an etching selectivity of the first spacer, the second spacer and the cap layer, and the etching selectivity of the cap layer is higher than the etching selectivity of the first spacer and the second spacer.

11. The method according to claim 1, further comprising removing the first spacer within the second region after the step of forming the mask layer.

* * * * *